(12) United States Patent
Nies et al.

(10) Patent No.: US 10,672,970 B2
(45) Date of Patent: Jun. 2, 2020

(54) THERMOELECTRIC GENERATOR

(71) Applicant: AVX Corporation, Fountain Inn, SC (US)

(72) Inventors: Craig W. Nies, Myrtle Beach, SC (US); Andrew P. Ritter, Simpsonville, SC (US)

(73) Assignee: AVX Corporation, Fountain Inn, SC (US)

( * ) Notice: Subject to any disclaimer, the term of this patent is extended or adjusted under 35 U.S.C. 154(b) by 203 days.

(21) Appl. No.: 15/010,755

(22) Filed: Jan. 29, 2016

(65) Prior Publication Data

US 2016/0149108 A1 May 26, 2016

Related U.S. Application Data

(62) Division of application No. 14/209,371, filed on Mar. 13, 2014.

(60) Provisional application No. 61/789,505, filed on Mar. 15, 2013.

(51) Int. Cl.
| | |
|---|---|
| *H01L 35/08* | (2006.01) |
| *H01L 35/32* | (2006.01) |
| *H01L 35/34* | (2006.01) |
| *H01L 35/30* | (2006.01) |
| *H01L 35/22* | (2006.01) |

(52) U.S. Cl.
CPC ............ *H01L 35/325* (2013.01); *H01L 35/08* (2013.01); *H01L 35/22* (2013.01); *H01L 35/30* (2013.01); *H01L 35/32* (2013.01); *H01L 35/34* (2013.01)

(58) Field of Classification Search
CPC .......... H01L 35/00; H01L 35/02; H01L 35/04; H01L 35/08
See application file for complete search history.

(56) References Cited

U.S. PATENT DOCUMENTS

| | | | |
|---|---|---|---|
| 5,168,339 | A | 12/1992 | Yokotani et al. |
| 5,288,336 | A | 2/1994 | Strachan et al. |
| 5,430,322 | A | 7/1995 | Koyangi et al. |
| 6,005,182 | A | 12/1999 | Imanishi et al. |
| 6,091,014 | A | 7/2000 | Eklund et al. |
| 6,747,572 | B2 | 6/2004 | Bocko et al. |
| 7,351,906 | B2 | 4/2008 | Yotsuhashi et al. |
| 7,834,263 | B2 | 11/2010 | DeSteese et al. |
| 7,888,583 | B2 | 2/2011 | Lagally et al. |
| 7,942,010 | B2 | 5/2011 | Bell et al. |
| 8,101,846 | B1 | 1/2012 | Schroeder et al. |

(Continued)

OTHER PUBLICATIONS

Article—Shin et al., "Li-Doped Nickel Oxide as a Thermoelectric Material," *Jpn. J. Appl. Phys.*, vol. 38, 1999, pp. L1336-L1338.

(Continued)

*Primary Examiner* — Christina Chern
(74) *Attorney, Agent, or Firm* — Dority & Manning, P.A.

(57) ABSTRACT

Disclosed are apparatus and methodology for constructing thermoelectric devices (TEDs). N-type elements are paired with P-type elements in an array of pairs between substrates. The paired elements are electrically connected in series by various techniques including brazing for hot side and/or also cold side connections, and soldering for cold side connections while being thermally connected in parallel. In selected embodiments, electrical and mechanical connections of the elements may be made solely by mechanical pressure.

12 Claims, 3 Drawing Sheets

(56) References Cited

U.S. PATENT DOCUMENTS

| | | | |
|---|---|---|---|
| 8,933,317 | B2 | 1/2015 | Moczgemba et al. |
| 9,051,175 | B2 | 6/2015 | Matus et al. |
| 2002/0024154 | A1 | 2/2002 | Hara et al. |
| 2002/0154470 | A1 | 10/2002 | Walsh |
| 2005/0241690 | A1 | 11/2005 | Tajima et al. |
| 2006/0118160 | A1 | 6/2006 | Funahashi et al. |
| 2006/0157102 | A1 | 7/2006 | Nakajima et al. |
| 2008/0212261 | A1 | 9/2008 | Ajayan et al. |
| 2009/0142984 | A1 | 6/2009 | Logunov et al. |
| 2009/0173932 | A1 | 7/2009 | Ohta et al. |
| 2010/0031986 | A1 | 2/2010 | Okamura |
| 2010/0116308 | A1 | 5/2010 | Hayashi et al. |
| 2010/0132755 | A1 | 6/2010 | Uchida et al. |
| 2011/0016888 | A1 | 1/2011 | Haaß et al. |
| 2011/0067742 | A1* | 3/2011 | Bell ............ F01N 3/043 136/204 |
| 2011/0088737 | A1 | 4/2011 | Nakamura et al. |
| 2011/0088739 | A1 | 4/2011 | Zinn et al. |
| 2011/0099991 | A1* | 5/2011 | Stefan ............ H01L 35/08 60/320 |
| 2011/0132002 | A1 | 6/2011 | Lee et al. |
| 2011/0132422 | A1 | 6/2011 | Yajima et al. |
| 2011/0139207 | A1 | 6/2011 | Edwards |
| 2012/0048321 | A1 | 3/2012 | Danenberg et al. |
| 2012/0049315 | A1* | 3/2012 | Kim ............ H01L 35/32 257/467 |
| 2012/0055527 | A1 | 3/2012 | Zika-Beyerlein |
| 2012/0097206 | A1 | 4/2012 | Sadaoka et al. |
| 2013/0026427 | A1 | 1/2013 | Backhaus-Ricoult et al. |
| 2013/0032188 | A1* | 2/2013 | Kajihara ............ H01L 35/08 136/200 |
| 2013/0061901 | A1 | 3/2013 | Tohei et al. |

OTHER PUBLICATIONS

Article—Wang et al., "Effects of YSZ Additions on Thermoelectric Properties of Nb-Doped Strontium Titanate," *Journal of Electric Materials*, vol. 29, No. 9, pp. 1777-1781.

Wunderlich et al.; "Effective Mass Thermoelectric Properties of $SrTiO_3$-based Natural Superlattices Evaluated by ab-initio Calculations", 24th International Conference on Thermoelectrics, Jun. 19, 2005.

Ohta et al.; "Giant thermoelectric Seebeck Coefficient of a Two-Dimensional Electron Gas in $SrTiO_3$"; Natura Materials, vol. 7; Jan. 21, 2007.

Wunderlich et al.; "Enhanced Effective Mass in Doped $SrTiO_3$ and Related Perovskites"; Physica B: Condensed Matter, vol. 404; Aug. 1, 2009.

Cui et al.; "Thermoelectric Properties of Heavily Doped n-type $SrTiO_3$ Bulk Materials"; Journal of Electronic Materials, vol. 28; Sep. 11, 2009.

PCT International Search Report for PCT International Application No. PCT/US14/27070; completed Jun. 27, 2014; dated Jul. 18, 2014.

PCT Written Opinion of the International Searching Authority for PCT International Application No. PCT/US14/27070; completed Jun. 27, 2014; dated Jul. 18, 2014.

PCT International Search Report for PCT International Application No. PCT/US14/27053; completed Jun. 20, 2014; dated Jul. 28, 2014.

PCT Written Opinion of the International Searching authority for PCT International Application No. PCT/US14/27053; completed Jun. 20, 2014; dated Jul. 28, 2014.

* cited by examiner

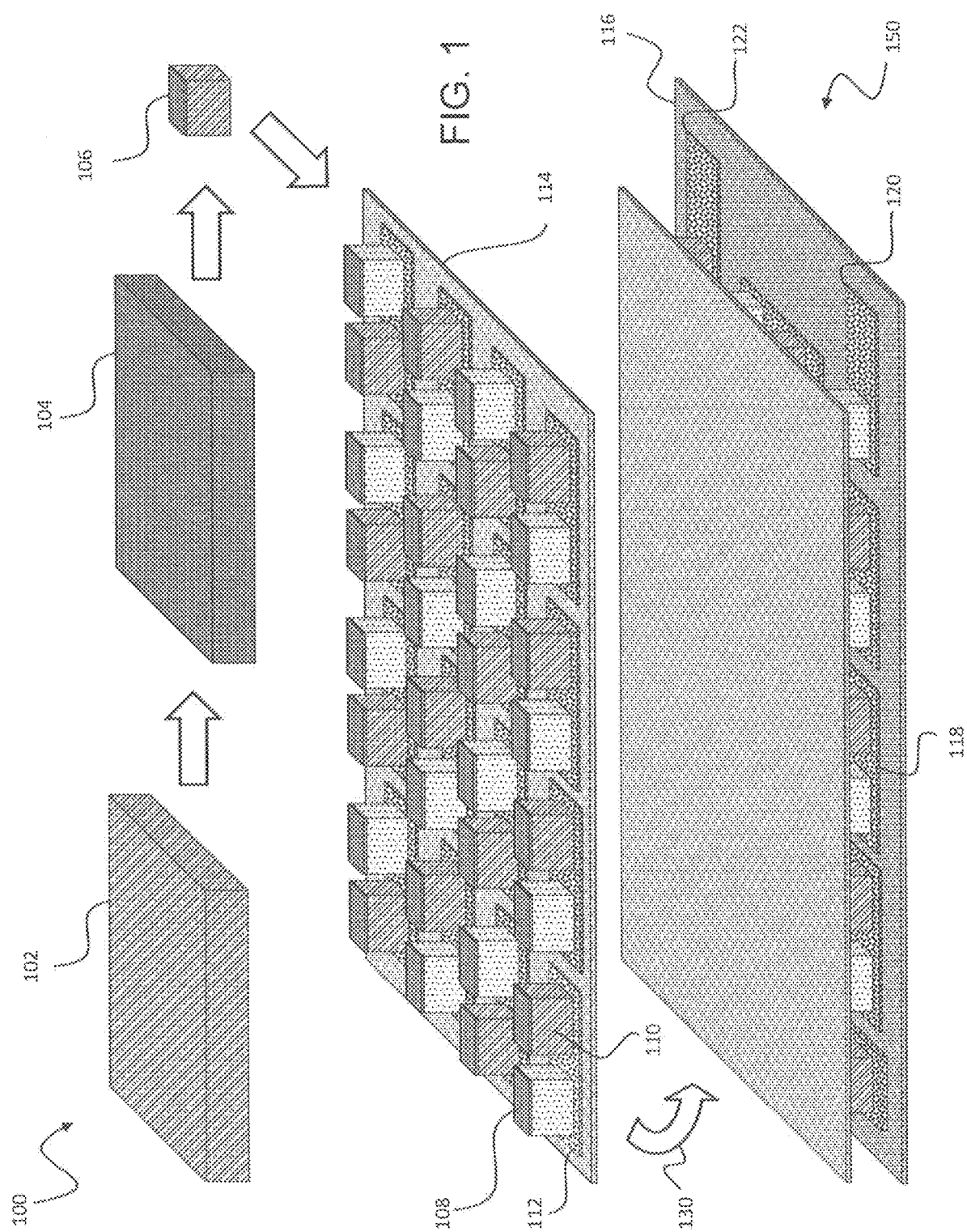

THERMOELECTRIC GENERATOR

PRIORITY CLAIM

This application is a divisional of prior pending U.S. patent application Ser. No. 14/209,371 filed Mar. 13, 2014 entitled "THERMOELECTRIC GENERATOR", which claims the benefit of previously filed U.S. Provisional Patent Application of the same title assigned U.S. Ser. No. 61/789,505, as filed Mar. 15, 2013, which are hereby incorporated herein by reference in their entireties for all purposes. Any disclaimer that may have occurred during prosecution of the above-referenced application(s) is hereby expressly rescinded.

FIELD OF THE SUBJECT MATTER

The presently disclosed subject matter relates to devices for converting thermal energy to electrical energy generators. More particularly, the presently disclosed subject matter relates to thermoelectric generators (TEGs) and methodologies for constructing such devices using electrically coupled doped semiconductive ceramic elements to generate electricity based on temperature differences between portions of the coupled elements.

BACKGROUND OF THE SUBJECT MATTER

The presently disclosed subject matter generally concerns improved component design for generating electrical energy based on the Peltier/Seebeck effect.

Known references that include examples of features for thermally generating electricity include U.S. Pat. No. 5,288,336 to Strachan et al. entitled "Thermoelectric energy conversion," U.S. Pat. No. 5,430,322 to Koyanagi et al. entitled "Thermoelectric element sheet in which thermoelectric semiconductors are mounted between films," U.S. Pat. No. 6,005,182 to Imanishi et al. entitled "Thermoelectric conversion module and method of manufacturing the same," U.S. Pat. No. 6,091,014 to Eklund et al. entitled "Thermoelectric materials based on intercalated layered metallic systems," U.S. Pat. No. 7,351,906 to Yotsuhashi et al. entitled "Method of manufacturing crystalline film, method of manufacturing crystalline-film-layered substrate, method of manufacturing thermoelectric conversion element, and thermoelectric conversion element," U.S. Pat. No. 7,888,583 to Lagally et al. entitled "Semiconductor nanowire thermoelectric materials and devices, and processes for producing same," and U.S. Pat. No. 7,942,010 to Bell et al. entitled "Thermoelectric power generating systems utilizing segmented thermoelectric elements."

In addition, examples of U. S. Published Patent Applications that include features for thermally generating electricity include U. S. Pub 2010/0031986 to Okamura entitled "Thermoelectric Module," U. S. Pub 2010/0116308 to Hayashi et al. entitled "Thermoelectric conversion element, thermoelectric conversion module, method for producing thermoelectric conversion element," U. S. Pub 2010/0132755 to Uchida et al. entitled "Thermoelectric Conversion Material, Method for Producing the Same, Thermoelectric Conversion Device and Method of Improving Strength of Thermoelectric Conversion Material," U. S. Pub 2011/0016888 to Haas et al. entitled "Thermoelectric Module," and U. S. Pub 2011/0088737 to Nakamura et al. entitled "Thermoelectric conversion module and method for manufacturing thermoelectric conversion module."

While various aspects and alternative features are known in the field of thermoelectric electrical energy generation and related methods for manufacture, no one design has emerged that generally addresses all of the issues as discussed herein. The disclosures of all the foregoing United States patents and published patent applications are hereby fully incorporated into this application for all purposes by virtue of present reference thereto.

SUMMARY OF THE SUBJECT MATTER

In view of the recognized features encountered in the prior art and addressed by the presently disclosed subject matter, improved apparatus and methodology for generating electrical energy using multi-layer ceramic elements have been developed.

In an exemplary configuration, thermoelectric modules are constructed by coupling n-type and p-type materials as individual elements to form pairs connected in series electrically, in parallel thermally, and connecting such pairs in an electrically series, thermally parallel configuration.

In exemplary such configurations, the n-type material may in some embodiments be based at least in part on $SrTiO3$ while the p-type maternal may in some embodiments be based on NiO material. Both materials may incorporate doping materials including, for example, Nb and La with the $SrTiO3$ and Li with the NiO material. They are produced using various standard ceramic processing techniques, with small variations allowing greater control and enhancement of electrical properties.

The use of ceramic processing to create these elements has the advantages of simplicity and versatility over typical preparation techniques for common thermoelectric elements. For example, many commercial thermoelectric semiconductor materials (for example, bismuth telluride) are produced by common single crystal preparation methods (Czochralski method or zone refining) which are applicable to a more limited materials set, and do not allow microstructural engineering as described herein. On the other hand, ceramic processing as currently practiced can be used on a wide variety of compositions and allows layer-by-layer control of composition and microstructure. Furthermore, thick and thin film techniques can be easily utilized to produce terminations which are conducive to the high temperatures which thermoelectric element will see.

A thermoelectric module may be created by sandwiching pairs of the n-type and p-type elements in such a way as to form a plurality of pairs of elements electrically connected in series while being thermally connected in parallel.

In one present exemplary embodiment, a thermoelectric device for converting thermal energy to electrical energy based on temperature differences between portions of the device preferably comprises a plurality of N-type oxide ceramic elements; a plurality of P-type oxide ceramic elements, respectively paired with such plurality of N-type elements; a pair of supporting ceramic substrates, supporting a plurality of conductive traces thereon, and with such paired N-type and P-type elements received on selected of such conductive traces so as to form an array of such pairs between such substrates; and at least one pair of connection terminals provided on at least one of such substrates, for the connection of leads thereto. In such exemplary embodiment, preferably such paired elements are electrically connected in series by such conductive traces and thermally connected in parallel relative to such substrates, so that generated electricity may be conducted from such array based on temperature differences between portions of such paired elements based on the Peltier/Seebeck effect.

In another present exemplary embodiment, a thermoelectric device for converting thermal energy to electrical energy using electrically coupled doped semiconductive ceramic elements to generate electricity based on temperature differences between portions of the device, preferably comprises a plurality of N-type elements, each comprising a doped semiconductive oxide ceramic element; a plurality of P-type elements, each comprising a doped semiconductive oxide ceramic element, respectively paired with such plurality of N-type elements; a pair of supporting ceramic rings forming concentric radial configurations having a generally open central portion adapted for exposure to a heat source with the exterior portion of the thermoelectric device adapted for exposure to an environment cooler than such heat source, and with such paired N-type and P-type elements received on selected portions of such ceramic rings so as to form a radial array of such pairs; and electrical connections for electrically connecting such paired elements in series while such paired elements are thermally connected in parallel relative to such ceramic rings, so that generated electricity may be conducted from such array based on temperature differences between portions of such paired elements based on the Peltier/Seebeck effect.

In yet another exemplary embodiment, a thermoelectric generator module for converting thermal energy to electrical energy using electrically coupled doped semiconductive ceramic elements to generate electricity based on temperature differences between portions of the module based on the Peltier/Seebeck effect, preferably comprises a plurality of N-type elements, each comprising a doped semiconductive oxide ceramic element; a plurality of P-type elements, each comprising a doped semiconductive oxide ceramic element, respectively paired with such plurality of N-type elements; an opposing pair of generally planar supporting ceramic substrates, supporting a plurality of complementary conductive traces thereon, and with such paired N-type and P-type elements received on selected of such conductive traces so as to form an array of such pairs sandwiched between such substrates; and at least one pair of connection terminals provided on at least one of such substrates, for the connection of leads thereto. In such exemplary embodiment, preferably such paired elements are electrically connected in series by such conductive traces and thermally connected in parallel relative to such substrates, so that generated electricity may be conducted from such array via such connection terminals based on temperature differences between portions of such paired elements.

Those of ordinary skill in the art from reviewing the presently disclosed subject matter will appreciate that such disclosure is intended to encompass both apparatus and corresponding and/or associated methodologies. One exemplary method relates to methodology for generating electrical energy based on the Peltier/Seebeck effect using oxide ceramic elements by providing a thermoelectric module constructed by coupling N-type and P-type materials as individual elements to form pairs electrically connected in series and thermally in parallel between opposing supporting substrates.

In another present exemplary embodiment, such method may relate to methodology for manufacturing a thermoelectric generator module for converting thermal energy to electrical energy using electrically coupled doped semiconductive oxide ceramic elements to generate electricity based on temperature differences between portions of the module based on the Peltier/Seebeck effect. Such methodology may comprise providing an opposing pair of generally planar supporting ceramic substrates, supporting a plurality of complementary conductive traces thereon; placing an array of plural paired N-type elements and P-type elements in electrical communication with such conductive traces so that the paired elements are electrically connected in series by such conductive traces, such elements each comprising a doped semiconductive oxide ceramic element, and such that such elements are thermally connected in parallel relative to such substrates; and attaching at least one pair of connection terminals on at least one of such substrates, for the connection of leads thereto, so that generated electricity may be conducted from such array via such connection terminals based on temperature differences between portions of such paired elements.

Another present exemplary embodiment of presently disclosed methodology relates to a method of providing a thermoelectric device for converting thermal energy to electrical energy based on temperature differences between portions of the device. Such an exemplary method may preferably comprise forming respective pluralities of N-type and P-type oxide ceramic elements; providing a pair of ceramic substrates with a plurality of predetermined conductive traces thereon; respectively pairing and aligning such N-type and P-type elements on selected of such conductive traces so as to form an array of such pairs electrically connected in series and captured between such substrates and thermally connected in parallel between opposing determined hot and cold sides thereof; and forming at least one pair of connection terminals on at least one of such substrates, for the connection of leads thereto, so that generated electricity may be conducted from such array based on temperature differences between such hot and cold sides based on the Peltier/Seebeck effect.

Yet another presently disclosed exemplary method relates to a method of making a thermoelectric device for converting thermal energy to electrical energy using electrically coupled doped semiconductive oxide ceramic elements to generate electricity based on temperature differences between portions of the device, comprising forming a plurality of N-type elements, each comprising a doped semiconductive oxide ceramic element; forming a plurality of P-type elements, each comprising a doped semiconductive oxide ceramic element, respectively paired with such plurality of N-type elements; providing a pair of supporting ceramic rings forming concentric radial configurations having a generally open radially central portion adapted for exposure to a heat source with the radially exterior portion of the thermoelectric device adapted for exposure to an environment cooler than such heat source; placing such paired N-type and P-type elements on selected portions of such ceramic rings so as to form a radial array of such pairs; and electrically connecting such paired elements in series while such paired elements are thermally connected in parallel relative to such ceramic rings. Per such exemplary method, generated electricity may be conducted from such array based on temperature differences between portions of such paired elements based on the Peltier/Seebeck effect.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIG. 1 illustrates an exemplary assembly process for constructing thermoelectric generators (TEGs) in accordance with the presently disclosed subject matter;

Figure 2A:
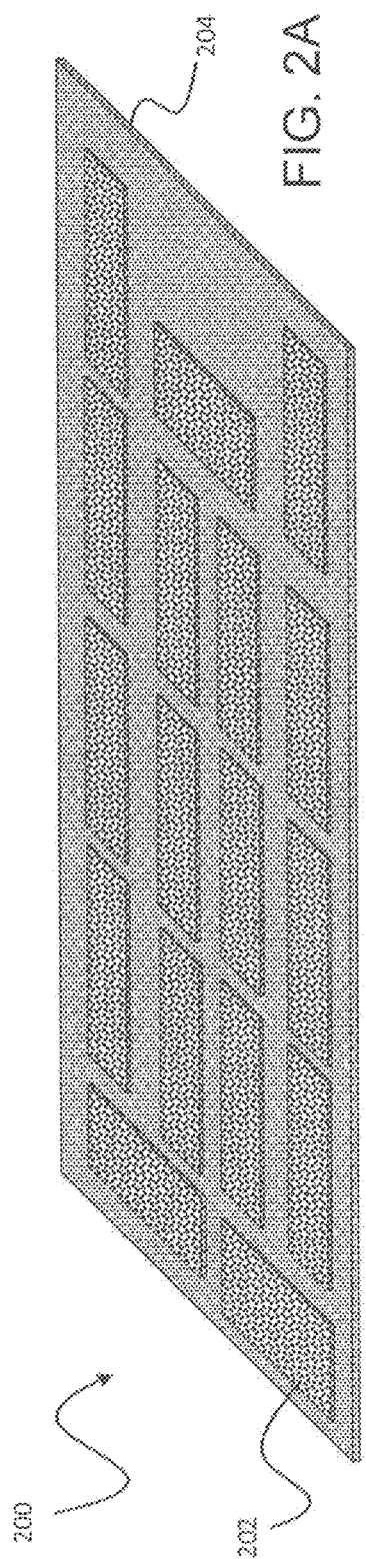
FIGS. 2A-2C illustrate an alternative embodiment of the presently disclosed subject matter employing screen-printed substrates.

Repeat use of reference characters throughout the present specification and appended drawings is intended to represent same or analogous features, elements, or steps of the presently disclosed subject matter.

DETAILED DESCRIPTION OF THE PREFERRED EMBODIMENTS

As discussed in the Summary of the Subject Matter section, the presently disclosed subject matter is particularly concerned with improved apparatus (devices) for generating electrical energy based on the Peltier/Seebeck effect and methodologies for constructing such devices.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. Additionally, certain features may be interchanged with similar devices or features not expressly mentioned which perform the same or similar function or functions.

Reference is made in detail herein to presently preferred exemplary embodiments of the subject thermoelectric generators and methodologies for constructing such generators. With initial reference to FIG. 1, there is illustrated an exemplary assembly process generally 100 for constructing exemplary thermoelectric generators (TEGs) in accordance with the presently disclosed subject matter. Assembly process 100 begins with the formation of blanks 102 of both p-type and n-type materials that are then formed into individual oxide thermoelectric elements as described herein. As will be understood by those of ordinary skill in the art from the complete disclosure herein, process 100, for simplicity of illustration, illustrates only a single block 102 representative of both p-type and n-type material blocks.

To construct a thermoelectric module such as exemplary module generally 150, elements of p-type and n-type semiconducting materials are preferably used. Such materials may be prepared from common ceramic raw materials, using standard ceramic engineering processing, with the following general procedure.

An n-type semiconducting oxide ceramic composition in accordance with the presently disclosed subject matter may be constructed primarily of strontium titanate ($SrTiO_3$) with from 0 to 5 weight percent of added such as strontium oxide, niobium oxide, lanthanum oxide, bismuth oxide, silicon dioxide, aluminum oxide, sodium oxide, tantalum oxide, neodymium oxide, cerium oxide, molybdenum oxide, tungsten oxide and/or titanium dioxide to create a strongly semiconducting composition. These components may be added in the form of oxides, carbonates, nitrates, acetates or any other reagents bearing the correct cation.

Similarly, a p-type semiconducting oxide ceramic composition in accordance with the presently disclosed subject matter may be constructed primarily of nickel oxide with from 0 to 8 weight percent of added lithium oxide, sodium oxide, potassium oxide and/or bismuth oxide. Such components may be added in the form of oxides, carbonates, nitrates, acetates or any other reagents bearing the correct cation.

The n-type and p-type compositions may be separately blended and calcined to form one or more solid solution ceramic materials which are then milled to approximately 1 um average particle size, prior to binder addition and green body forming operations. Alternatively, such materials may be cake batched and milled in an appropriate solvent (aqueous or non-aqueous) for green formation. Following this, an appropriate binder is added and green forming is performed. In such case, the calcination would occur during the firing operation, forming one or more solid solution ceramic materials at that time.

A green body formation technique is then preferably utilized which will allow the formation of ceramic blanks 102 from which individual elements 106 will be cut. The green body formation technique used can be selected from several different choices, depending on the degree of complexity and desired properties of the final ceramic n-type or p-type element. Non-limiting examples of exemplary techniques for forming ceramic blanks 102 include die-pressing, extrusion, tape casting, and wet laydown.

In an exemplary die-pressing process, the milled ceramic powder or slurry formulation may be mixed with a solution of polymers including binders and plasticizers, then dried and granulated to produce a dry pressing feedstock. The feedstock may then be dry-pressed to form disks or plates.

In an exemplary extrusion process, the ceramic powders are combined with organic binder system (in either an aqueous or organic solvent carrier) to form a doughlike feedstock, which may then be extruded to form rods, bars or plates of any advantageous cross-section. Such rods, bars, or plates may then be diced across their cross-section to form the ceramic blanks.

In an exemplary tape casting process, the milled ceramic slurry may be combined with a binder solution system to form a slip. The ceramic slips are tape cast into layers ranging from 0.5 micron up to 100 microns or more. Such layers may be stacked to the desired thickness and then laminated, forming green ceramic pads, which may be saw-diced or blade-diced to form the ceramic blanks.

In an exemplary wet laydown process, the milled ceramic slurry is combined with a binder solution system to form a somewhat different slip, which may be successively applied to a carrier plate and dried. Representative non-limiting examples of application methods of the slip to the carrier include, for example, doctor blading, screen printing, spraying, or waterfall casting. In such manner, a pad of the correct thickness is built up on the carrier plate. The final pad is dried and may be diced to form ceramic blanks 102 either before or after release from the carrier plate.

Because each of such exemplary alternative methods can allow for multiple layers to be combined into the green body, a highly engineered ceramic body with controlled composition and microstructure may be formed. A benefit of such green-body fabrication techniques is that a variety of features may easily be incorporated into the thermoelectric elements, i.e. the elements may be "engineered". These features include, without limitation, dispersion of fine porosity to reduce thermal conductivity while largely maintaining low electrical conductivity; dispersion of discrete metal particles, especially at the "ends" of the element to facilitate joining of elements to metallized substrates; incorporation of floating tab electrodes, similar to so-called dummy electrodes (anchor tabs) used in Fine Copper Termination (FCT) to help anchor external metallization to the "ends" of the elements; and graded and/or lamellar structures that may be employed to create non-uniform concentrations of porosity, metallization and/or chemical composition typically, but not exclusively, along the axis perpendicular to the end-caps of the device. It should be appreciated by those of ordinary skill in the art that combinations of these features can be used to manipulate thermal expansion properties to reduce stress gradients between dissimilar materials. Attributes obtained from such engineered elements include achievement of low thermal conductivity, high electrical conductivity, and durable high-temperature bonds between element and substrate.

It should also be appreciated by those skilled in the art that these techniques might be applied to any other material or combination of materials which may be prepared in a powder form and when thermally treated, will form a material with thermoelectric properties. For example, barium strontium niobate has been prepared in a ceramic form and has been shown to exhibit interesting thermoelectric characteristics. The powder forms of barium strontium niobate precursors and dopants (e.g. niobium or lanthanum oxides) may be combined and formed using the above processes, producing similar microstructural features.

Metal particles such as nickel, copper, silver, palladium, etc., may be added to the slip or feedstock to create a ceramic/metal composite in given layers, particularly outer contact surfaces. Such metal particle addition is advantageous for creating improved electrical contact with external metallization and/or for matching thermal expansion of elements and contacting substrates or headers.

A slip or feedstock with an excess of donor ions for n-type materials and acceptor ions for p-type materials may be used to heavily dope the outer layers of the blanks, where external metallization may be brought in contact with the materials. Heavy doping may be used to achieve strongly ohmic contacts in semiconductors.

Small electrode tabs may be incorporated into the surface of the element, which, when exposed by dicing or polishing, will improve the intimacy of contact between the external metallization and the ceramic, and provide anchoring points for applied external metallization layers. In accordance with the presently disclosed subject matter, such metallization layers may be applied using plating, sputtering, evaporation, screen printing techniques, or other known or future developed processes.

Tape casting and wet buildup are presently generally preferred methods for some embodiments as such methods generally provide greater thickness control and finer resolution than can be achieved using other methods. Other methods may, however, be employed depending on the precision required for construction of particular embodiments of the presently disclosed subject matter.

It should be noted that at this point, like many conventional ceramic electronic components, elements near their final size could be directly diced from the pads or blanks, rather dicing as blanks, firing the blanks and dicing the fired blanks into elements. The eventual inclusion of blank lapping is advantageous to providing the dimensional control for later alignment of the elements between headers.

Following green forming the organic binders may be removed from the blanks using standard burnout techniques. Blanks containing only ceramic powder or ceramic powder and polymer microspheres may be burned out in air at temperatures of up to 750° C. using slow ramp rates, for example, on the order of 2° C. per minute. Blanks containing metal powders may be burned out in air or in reducing atmosphere depending on the requirements of the metal to avoid deleterious oxidation or reduction reactions. Removal of nearly all of the organic material is generally desirable as remaining carbon may influence the furnace atmosphere during firing, or cause delamination or other green defects during firing. A single layer of parts on each setter is generally recommended.

The blanks 102 may then be fired to densify the body, create the desired microstructure, and distribute the dopants to yield a strongly semiconducting body. Each ceramic composition generally has its own preferred firing profile. For example, the strontium titanate-based n-type material typically would be fired at temperatures ranging from 1275 to 1400° C. for 2 to 16 hours in a reducing atmosphere with oxygen partial pressures ranging from 10-6 to 10-18 atm. The nickel oxide p-type ceramic typically would be fired at temperatures ranging from 1225 to 1400° C. for 1 to 4 hours in an air or otherwise oxidizing environment.

During firing, minimization of the amount of camber in the fired blanks is important. For example, following burnout, the blanks may be positioned on the firing setters and covered with weighted plates to encourage flatness. Alternatively, blanks may be fired in stacks as a technique for generally maintaining flatness during firing. Maintaining flatness allows the ceramic to be more easily polished to a consistent thickness. Also, firing in stacks or surrounding the material with a similar composition of ceramic assists in controlling the loss of any volatile components from the blanks (e.g. lithium from NiO) to the setters or furnace environment.

Individual elements 106 may be cut from the fired blanks 102 or from plated blanks 104. During module construction, elements 106 may be sandwiched between two metallized insulators or "headers." Because elements 106 generally are to be aligned with contacts in the same plane, it is preferable to maintain dimensional control over them in such direction. As noted, individual elements can also be cut from greenware, prior to firing. This substantially avoids issues related to camber, but requires appropriate fired dimensional control and suitable termination procedures.

Maintenance of dimensional control may be achieved in several ways. In accordance with exemplary such ways, the fired blanks may be lapped, for example using double-sided grinding, to a consistent thickness. Such process may be advantageous when metal or additional doping is used in the outer layers for electrical contact or bonding purposes. In such case, the substrates will be metallized as represented by structure 104 after the lapping procedure but before the element dicing procedure.

Alternatively, the blanks may be diced such that the thickness of the element is dictated by the lateral dimension during dicing. Such technique is advantageous when tab electrodes are created in the blank and are exposed by dicing, again to enhance bonding and contact. In such case, the parts will be diced into strips to expose the tabs and the tab surfaces would then be metallized. After surface metallization, an additional dicing to singulate the elements 106 from the strips would preferably be performed.

The desired metallization may then be applied to the correct surfaces. It is preferable per the presently disclosed subject matter to select metallization which yields a strong ohmic contact, with good mechanical adhesion. The desired procedure typically starts with a rigorous cleaning procedure using solvents such as alcohols and acetone, and ceramic etchants such as fluoboric acid and hydrogen peroxide, followed by thorough drying.

Metallization preferably may then proceed as follows. For the n-type strontium titanate elements, a sputter etch may be performed, followed by a sputtered layer of, for example, 1000 angstroms of titanium-tungsten. Such step is followed by a layering of, for example, 1000 angstroms of nickel which may contain some vanadium. Finally, the nickel layer may be capped by approximately 100 angstroms of sputtered gold. Such layers serve as an adhesion layer on which other surface metallization may be deposited, for example by electroplating. In an exemplary construction, an electroplated layer may be approximately 10-25 microns thick and may correspond to copper, silver, gold, nickel, nickel-phosphorus or any metal producing a relatively low resistance contact and favorable bonding with the header metallization.

For the p-type nickel oxide elements, various methods may be used to create an adhesion layer. In a first exemplary method, cleaned surfaces may be activated with palladium and then coated with copper via electroless plating. In an exemplary configuration, the copper plating may be 0.5 to 5 microns thick. In a second exemplary configuration, a sputter etch may be performed followed by application of a sputtered layer of nickel that optionally contains some vanadium, and a sputtered layer of gold. In an exemplary configuration, the nickel layer may be about 1000 angstroms thick while the gold layer may be about 100 angstroms thick. Following either of such approaches, contact metallization may again be deposited, for example by electroplating, to approximately 10-25 microns thick, and again may consist of copper, silver, gold, nickel, or any metal producing a low resistance contact and favorable bonding with the header metallization.

The n-type or p-type elements may then be diced from such substrates to dimensions giving adequate thermal insulation and low electrical resistance. In exemplary configurations, size may range from 125 microns in length, width and height to greater than 3 millimeters in each dimension, and may resemble such as rods, bars, or cubes. The dicing procedure should preferably result in electroded surfaces on opposite sides of each element, for property testing and eventual module construction.

With further reference to FIG. 1, thermoelectric modules generally 150 are assembled from p-type and n-type representative elements 106 where the elements 106 are typically of uniform size and properties. Elements 106 are arranged in pairs of p-type 108 and n-type 110 elements which are connected in series, for example, by way of representative conductive traces 112 on substrate 114. Configurations may also be used that combine series/parallel electrical connection—in order to manipulate device resistance (desirably low) while elements are thermally in parallel. In such manner, each couple contributes a characteristic amount of voltage for a given temperature difference between hot and cold surfaces which add together to yield the total voltage produced by the module. Because the elements are connected in series, the resistance for each couple also is additive; however, such resistance is detrimental to the overall power output by the module. It is, therefore, relatively important in preparing modules to preferably avoid as possible any increase in the overall resistance during the assembly of the modules 150.

With continued reference to FIG. 1, an exemplary procedure is represented for preparing sandwich-type modules consisting of one or more unicouples composed of oxide ceramic elements. In an exemplary such methodology in accordance with the presently disclosed subject matter, headers 114, 116, or ceramic substrates, with appropriate metallizations (representatively metallizations 112, 118), are fabricated from suitable materials including, for example and without limitation, aluminum oxide, aluminum nitride or other relatively high thermal conductivity, electrically insulating ceramic substrates. In exemplary configurations, such substrates may be formed with thicknesses typically ranging from 250 to 625 microns. Metallization can be applied by either thick film (screen printing/firing) or thin film (sputtering, evaporation, plating) techniques.

On one surface of each header 114, 116, the metallization 112, 118 may be preferably patterned to form the series connection between elements 108, 110, while generally a complete sheet of metallization will be applied to the other. Such approach is meant to facilitate thermal transfer between the heat source and the module on the hot side, and to facilitate heat removal from the cold side by adjunct or associated cooling reservoirs, coils, fins or air flow (not separately illustrated, details of which form no particular aspect of the presently disclosed subject matter). Such metallization may facilitate the physical bonding of heating and/or cooling structures to the presently disclosed exemplary module.

In exemplary configurations of thick film metallization, copper, nickel, silver, silver, palladium, platinum, or gold pastes, or pastes composed of alloyed powders of such, may be used. The selection would generally depend on the resistance desired and the type of bonding between element and header, or heat exchanging structure and header, for a particular embodiment. The selection would also dictate the firing profile needed to bond the metallization to the header.

In exemplary configurations of thin film metallizations, substrates are rigorously cleaned using solvents such as alcohols and acetone, and ceramic etchants such as fluoboric acid and hydrogen peroxide, followed by thorough drying. Following such step, a sputter etch may be performed, followed by applying a sputtered layer, such as of 1000 angstroms of titanium-tungsten. Such step is followed by 1000 angstroms of nickel (containing some vanadium), which is capped by approximately 100 angstroms of sputtered gold. Such layers serve to act as an adhesion layer, on which other surface metallization may be electroplated. Electroplating is approximately 5-25 microns thick, and may consist of copper, silver, gold, nickel, or any metal producing a relatively lower resistance contact and favorable bonding with the element metallization.

While the above-described thin film method is one presently favored, other adhesion layer materials may also be used. For example, copper-chromium-gold layers of metallization are known to provide good adhesion to ceramic substrates and devices. Also, a fired thick film layer may provide a well-adhered base for a plated layer of the various metals mentioned above.

Whereas screen printing thick film materials will provide the correct pattern to create the series connection for the ceramic elements, the thin film materials likely are patterned either by masked deposition or by conventional photolithographic techniques.

To begin module assembly, a method of alignment is selected to place the n-type and p-type parts in alternating positions directly over their metallized locations on the headers. Alignment may be accomplished in a number of ways including, without limitation, using alumina or graphite spacer bars or alignment forms with holes drilled at the appropriate locations. An appropriate bonding material (preform or paste) should also be placed on, or applied to, the metallization prior to element placement.

Because the modules will likely be better used with at least the hot-side header at temperatures exceeding 500° C., high temperature appropriate bonding techniques are preferably used for assembly. Also, effective use of the ceramic elements may, in some instances, require that the cold side exceed 150° C., which would prohibit use of a variety of low temperature brazes or solders. In accordance with the presently disclosed subject matter, several techniques may be used, including, without limitation: brazing both hot and cold sides simultaneously, using braze filler materials such as alloys of primarily copper and silver; and brazing hot and cold sides separately, allowing a high temperature bonding material such as a copper-silver alloy to be used on the hot side and a lower temperature alloy (such as high lead solder) to be used on the cold side. Additionally, copper-copper thermocompression bonding may be employed on at least the hot side of the module. Such process requires that copper surface layers be present during bonding and that the elements be uniform in size so that the pressure is uniform throughout each bonded surface.

Termination paste bonding involves use of a copper, nickel, silver, or alloy termination paste as the bonding medium between the element and the header. Such procedure offers several advantages including creating a bond that is stable at higher temperatures than available from brazing pastes, and the possibility of engineering the composition to minimize thermal stresses between the element and the header. However, it is preferable that excellent density is achieved in the contact region to achieve good electrical and thermal transport.

With continued reference to FIG. 1, bonding pads 120, 122 are provided on the cold side header 116 where wires, pins, or other devices (not separately illustrated, and details of which form no particular aspects of the present subject matter) may be soldered or brazed to allow connection of the module to either an electrical load which will use the thermoelectric power generated or to other thermoelectric generators in series to increase the voltage or current and therefore the overall power generated by the assembly.

It should be appreciated from the above that the construction sequence illustrated in FIG. 1 provides for separately forming n-type and p-type elements generally illustrated as element 106 by first forming separate blanks 102 from appropriate materials as previously described and then, optionally, metalizing blank 102 to produce a plated blank 104 which may then be singulated into individual elements 106. Pairs 108, 110 of the singulated elements are then arranged over and secured to metallizations 112 on header 114. Header 114 is then "flipped over" as indicated by arrow 130 and aligned over header 116 which has applied thereto metallizations 118 including terminal connections 120, 122. When the individual elements 106 are electrically connected to metallizations 118, the result is a series connection of a plurality of element pairs. In such configuration, each element pair provides a characteristic voltage output dependent on, among other things, the composition of the elements and the temperature difference between the hot side header 114 and the cold side header 116.

To improve the power output of the device in operation, the highest level of thermal contact between the exterior surfaces of the headers and the heat exchanging surfaces on the hot and cold side should preferably be maintained. Thermal interface materials such as metal sheets, thermal greases, graphite papers, and similar products may be used to improve the thermal contact, allowing more thermal energy to be transmitted to and taken away from the ends of the elements.

Figure 2B:
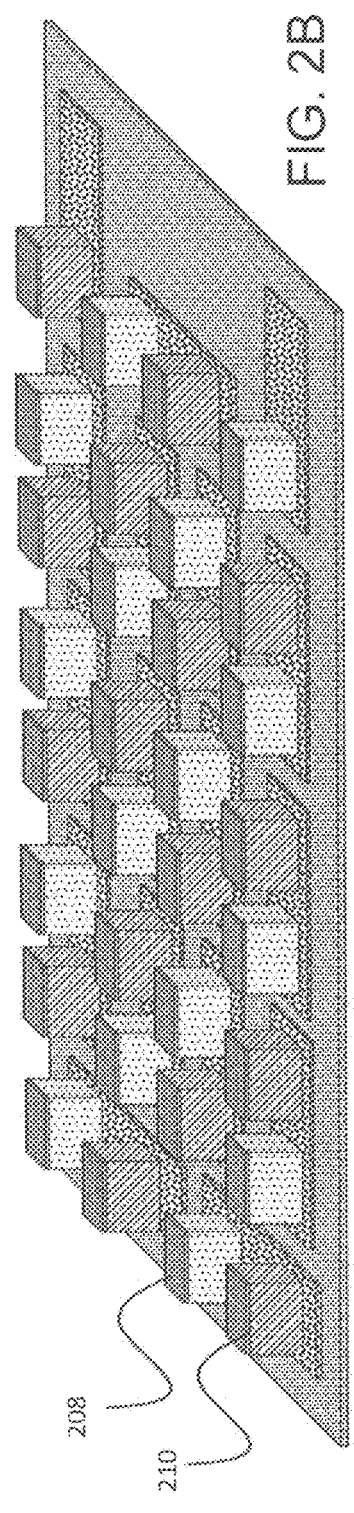
Figure 2C:
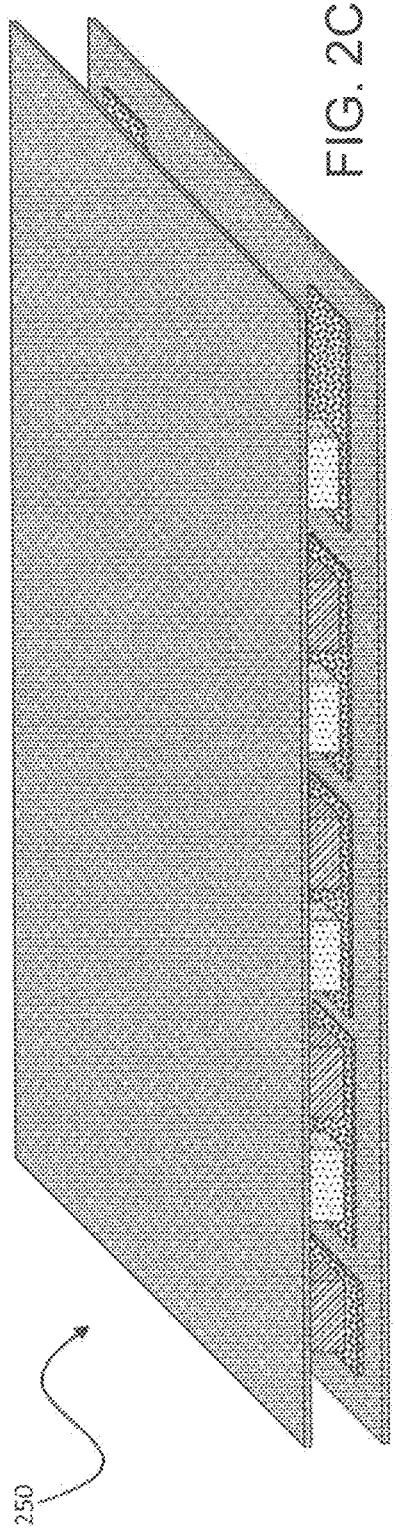

With reference now to FIGS. 2A-2C (generally FIG. 2), there is illustrated an alternative embodiment generally 200 of the presently disclosed subject matter employing screen-printed substrates. As illustrated, screen-printed copper paste 202 is applied to the top and bottom surfaces of substrate 204. The bottom (unseen) surface may have applied thereto copper paste in a configuration that, in conjunction with the illustrated top surface copper paste configuration, will result in an electrical connection of elements 208, 210 into serial connected pairs. An exemplary configuration of the unseen configuration on the bottom surface of substrate 204 may be similar to the metallizations 112 illustrated in FIG. 1 as applied to substrate 114. In accordance with the exemplary embodiment of FIG. 2, substrate 204 may be an Al2O3 substrate.

During construction of the exemplary embodiment of FIG. 2, the various elements 208, 210 are put in place preferably while the copper paste is still wet, and a top and bottom sandwich 250 is assembled. The sandwich is dried in an alignment fixture (not separately illustrated) and, after drying is removed from the alignment fixture and fired to form copper to copper bonds. Leads may then be attached to connection terminals (representatively illustrated in FIG. 1 as terminals 120, 122).

Figure 3B:
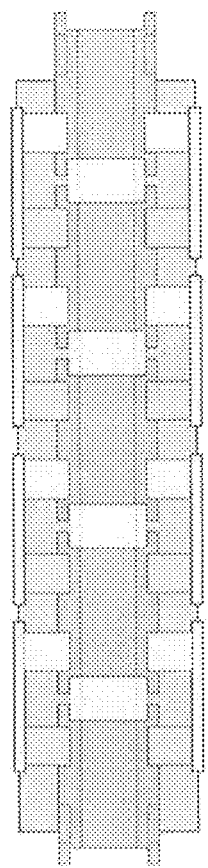
FIGS. 3A-3D respectively provide alternative exemplary configurations of an exemplary thermoelectric device in accordance with the presently disclosed subject matter.
Figure 3D:
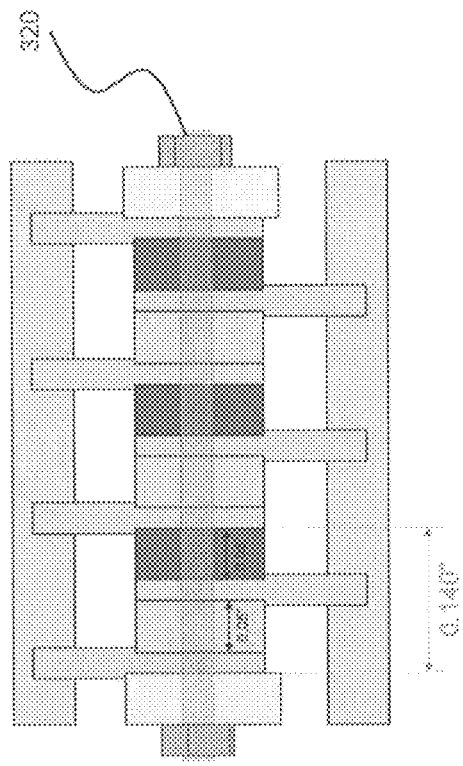
Figure 3A:
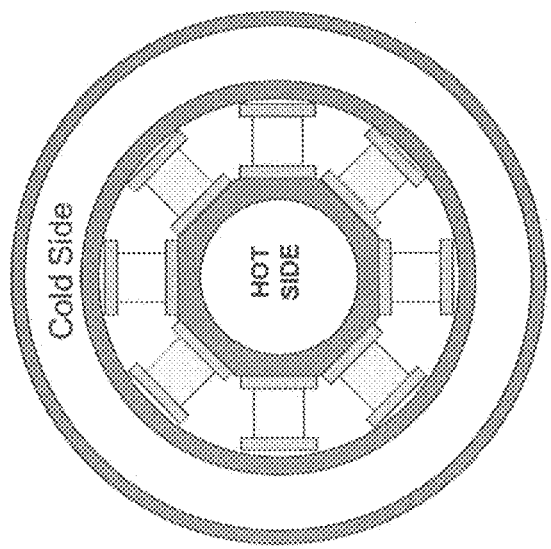
Figure 3C:
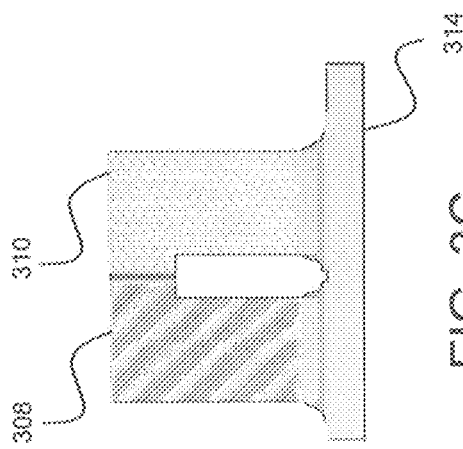

With reference now to FIGS. 3A-3D, there are illustrated respective additional alternative configurations that may be produced using the same p-type and n-type materials previously described. FIG. 3A illustrates an exemplary radial configuration wherein the "hot side" is centrally located and the "cold side" is on the perimeter of the device. Such an embodiment may be used advantageously for example with heat sources such as a fire or heat from a vehicle exhaust system. FIG. 3B illustrates another exemplary radial structure employing p-type and n-type tubing separated by ceramic rings. FIG. 3C illustrates an exemplary embodiment wherein the hot side of the elements 308, 310 are directly brazed together while the cold side of the elements 308, 310 are soldered to substrate 314. The FIG. 3D exemplary embodiment of the presently disclosed subject matter incorporates a mechanical retention mechanism (nuts and bolts 320) to produce a device that requires neither brazing nor soldering to retain the p-type and n-type elements in solid contact with each other.

As will be understood by those of ordinary skill in the art from the complete disclosure herewith, the presently disclosed subject matter may be particularly useful for adaptation for use in a variety of configurations where temperature differentials may be leveraged. Such may include, for example, pipe-mounted configurations such as for remote sensing, integrated into a wood fuel stove (either involving natural wood or pelletized wood), integrated into a gas stove for either such as commercial or military use, associated with an industrial furnace flue, associated with an automobile or other internal combustion engine exhaust system, or associated with a municipal or commercial solid waste disposal/generator. Also, while various applications may be practiced, variations of modules resulting from different configurations may be practiced, for creation of modules such as adapted for generating several Watts or more of power, and for operating with hot side temperatures on the order of 300 to 800 degrees C., with temperature differentials ($\Delta T$) of 100 degrees C. or higher.

While the presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. A thermoelectric device for converting thermal energy to electrical energy based on temperature differences between portions of the thermoelectric device, comprising:
    a plurality of N-type oxide ceramic elements;
    a plurality of P-type oxide ceramic elements, respectively paired with said plurality of N-type elements;
    a pair of supporting ceramic substrates, supporting a plurality of conductive traces thereon, and with said paired N-type and P-type elements received on selected of said conductive traces so as to form an array of such pairs between said pair of supporting ceramic substrates; and
    at least one pair of connection terminals provided on at least one of said pair of supporting ceramic substrates, for the connection of leads thereto,
    wherein said paired N-type and P-type elements are electrically connected in series by said conductive traces and thermally connected in parallel relative to said pair of supporting ceramic substrates, so that generated electricity may be conducted from the array based on temperature differences between portions of said paired N-type and P-type elements based on the Peltier/Seebeck effect,
    wherein said plurality of N-type and P-type elements comprise lamellar structures creating non-uniform metallization concentrations,
    wherein said pair of supporting ceramic substrates comprise ceramic rings forming concentric radial configurations having a generally open central portion adapted for exposure to a heat source with the exterior portion of the thermoelectric device adapted for exposure to an environment cooler than said heat source,
    wherein a first bonding material is disposed between a first end of at least one of said paired N-type and P-type elements and at least one of said conductive traces on one of the supporting ceramic rings and a second bonding material is disposed between a second end of said at least one of said paired N-type and P-type elements and at least one of said conductive traces on the other one of the supporting ceramic rings, and
    wherein the first bonding material comprises a copper-silver alloy, and the second bonding material comprises lead solder, and wherein a composition of the second bonding material is different than a composition of the first bonding material.

2. The thermoelectric device as in claim 1, wherein said conductive traces include brazing for one of the ends of said paired N-type and P-type elements.

3. A thermoelectric device for converting thermal energy to electrical energy based on temperature differences between portions of the thermoelectric device, comprising:
    a plurality of N-type elements, each comprising a doped semiconductive oxide ceramic element;
    a plurality of P-type elements, each comprising a doped semiconductive oxide ceramic element, respectively paired with said plurality of N-type elements;
    a pair of supporting ceramic rings forming concentric radial configurations having a generally open central portion adapted for exposure to a heat source with the exterior portion of the thermoelectric device adapted for exposure to an environment cooler than said heat source, and with said paired N-type and P-type elements received on selected portions of said pair of supporting ceramic rings so as to form a radial array of such pairs; and
    electrical connections for electrically connecting said paired N-type and P-type elements in series while said paired N-type and P-type elements are thermally connected in parallel relative to said pair of supporting ceramic rings, so that generated electricity may be conducted from the array based on temperature differences between portions of said N-type and P-type paired elements based on the Peltier/Seebeck effect,
    wherein said plurality of N-type and P-type elements comprise lamellar structures creating non-uniform metallization concentrations,
    wherein a first bonding material is disposed between a first end of at least one of said paired N-type and P-type elements and at least one of said conductive traces on one of the supporting ceramic rings and a second bonding material is disposed between a second end of said at least one of said paired N-type and P-type elements and at least one of said conductive traces on the other one of the supporting ceramic rings, and
    wherein the first bonding material comprises a copper-silver alloy, and the second bonding material comprises lead solder, and wherein a composition of the second bonding material is different than a composition of the first bonding material.

4. A thermoelectric device as in claim 3, further including mechanical retention mechanism for holding said paired N-type and P-type elements in mutual contact.

5. A thermoelectric device as in claim 4, wherein said mechanical retention mechanism includes at least one matching bolt and nut.

6. A thermoelectric, device as in claim 3, wherein said electrical connections further include brazing for one of the ends of said paired N-type and P-type elements and soldering for the other of the ends of said paired N-type and P-type elements.

7. A method of making a thermoelectric device for converting thermal energy to electrical energy based on temperature differences between portions of the thermoelectric device, comprising:
   forming a plurality of N-type elements, each comprising a doped semiconductive oxide ceramic element;
   forming a plurality of P-type elements, each comprising a doped semiconductive oxide ceramic element, respectively paired with said plurality of N-type elements;
   providing a pair of supporting ceramic rings forming concentric radial configurations having a generally open radially central portion adapted for exposure to a heat source with the radially exterior portion of the thermoelectric device adapted for exposure to an environment cooler than said heat source;
   placing said paired N-type and P-type elements on selected portions of said pair of supporting ceramic rings so as to form a radial array of such pairs; and
   electrically connecting said paired N-type and P-type elements in series by conductive traces on the pair of supporting ceramic rings while said paired N-type and P-type elements are thermally connected in parallel relative to said pair of supporting ceramic rings, so that generated electricity may be conducted from the array based on temperature differences between portions of said paired N-type and P-type elements based on the Peltier/Seebeck effect,
   wherein said plurality of N-type and P-type elements comprise lamellar structures creating non-uniform metallization concentrations,
   wherein electrically connecting said paired elements comprises bonding a first end of at least one of said paired N-type and P-type elements and at least one of said conductive traces on one of the supporting ceramic rings using a first bonding material and bonding a second end of said at least one of said paired N-type and P-type elements and at least one of said conductive traces on the other one of the supporting ceramic rings using a second bonding material, and
   wherein the first bonding material comprises a copper-silver alloy, and the second bonding material comprises lead solder, and wherein a composition of the second bonding material is different than a composition of the first bonding material.

8. A method as in claim 7, wherein bonding the second end of said at least one the paired N-type and P-type elements comprises directly brazing together ends of said paired N-type and P-type elements that are arranged closer towards the radially central portion of said thermoelectric device, and wherein bonding the first end of said at least one the paired N-type and P-type comprises soldering ends of said paired N-type and P-type elements that are arranged radially outward with respect to the radially central portion of said thermoelectric device to the one of the supporting ceramic rings.

9. The thermoelectric device of claim 3, wherein:
   said n-type semiconductive oxide ceramic element composition is constructed primarily of strontium titanate (SrTiO3) with from 0 to 5 weight percent of added strontium oxide, niobium oxide, lanthanum oxide, bismuth oxide, silicon dioxide, aluminum oxide, sodium oxide, tantalum oxide, neodymium oxide, cerium oxide, molybdenum oxide, tungsten oxide and/or titanium dioxide; and
   said p-type semiconductive oxide ceramic element composition is constructed primarily of nickel oxide with from 0 to 8 weight percent of added lithium oxide, sodium oxide, potassium oxide and/or bismuth oxide.

10. The thermoelectric device of claim 3, further comprising an adhesion layer respectively between said paired N-type and P-type elements and electrical connections thereof.

11. The thermoelectric device of claim 3, further comprising bonding pads on at least one of said pair of supporting ceramic rings.

12. The thermoelectric device of claim 3, wherein:
   said N-type elements comprise SrTiO3 material incorporating doping material comprising at least one of Nb and La; and
   said P-type elements comprise NiO material incorporating doping material comprising at least Li material.

* * * * *